(12) United States Patent
Sato

(10) Patent No.: US 7,450,620 B2
(45) Date of Patent: Nov. 11, 2008

(54) ELECTRODE STRUCTURE AND OPTICAL SEMICONDUCTOR ELEMENT

(75) Inventor: Atsushi Sato, Azumino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/550,824

(22) Filed: Oct. 19, 2006

(65) Prior Publication Data

US 2007/0096119 A1    May 3, 2007

(30) Foreign Application Priority Data

Oct. 27, 2005    (JP)    ............................. 2005-312506
Jun. 21, 2006    (JP)    ............................. 2006-171150

(51) Int. Cl.
*H01S 3/00*    (2006.01)

(52) U.S. Cl. ............................. 372/38.05; 372/29.013; 372/87

(58) Field of Classification Search ............ 372/29.013, 372/38.05, 87
See application file for complete search history.

(56) References Cited

U.S. PATENT DOCUMENTS

2002/0084747 A1 *   7/2002   Fujieda et al.   ............... 313/506

FOREIGN PATENT DOCUMENTS

JP            2004-288971            10/2004

* cited by examiner

*Primary Examiner*—Dung T Nguyen
(74) *Attorney, Agent, or Firm*—Harness, Dickey & Pierce, P.L.C.

(57) ABSTRACT

An electrode structure includes a first conductive layer, an insulation layer that covers at least a portion of a marginal area of an upper surface of the first conductive layer and has a first sloped section that slopes down toward the upper surface of the first conductive layer, a first electrode having one end formed on the first conductive layer and another end formed on the first sloped section, a third electrode that is formed on the first electrode and the insulation layer, and covers the another end of the first electrode.

5 Claims, 13 Drawing Sheets

ELECTRODE STRUCTURE AND OPTICAL SEMICONDUCTOR ELEMENT

The entire disclosure of Japanese Patent Application Nos: 2005-312506, filed Oct. 27, 2005 and 2006-171150, filed Jun. 21, 2006 are expressly incorporated by reference herein.

BACKGROUND

1. Technical Field

The present invention relates to electrode structures and optical semiconductor elements.

2. Related Art

A surface-emitting type semiconductor laser is one type of optical elements that emit laser light. The surface-emitting type semiconductor laser is provided with a laser resonator formed in a direction orthogonal to a surface of the substrate, and emits laser light from an upper surface of the laser resonator. In the surface-emitting type semiconductor laser, surfaces around the columnar laser resonator provided on the surface of the substrate may be coated and planarized with an insulation material such as polyimide. For example, Japanese Laid-open patent application JP-A-2004-288971 is an example of related art.

A structure of a surface-emitting type semiconductor laser is described below with reference to FIGS. 15A and 15B. As shown in FIG. 15A, a laser resonator 102 is formed on an upper surface of a semiconductor substrate 101. An insulation layer 103 composed of insulation material, such as, for example, polyimide resin is provided to cover surfaces around and on an upper surface along its marginal area of the laser resonator 102. In other words, the insulation layer 103 generally forms a hill configuration having a gently sloped section 103a in the region near the marginal area of the laser resonator 102, and planarized gradually with a gentle slope as it extends away from the laser resonator 102.

Further, a ring-shaped electrode 104 is formed on the upper surface of the laser resonator 102 and the insulation layer 103. The ring-shaped electrode 104 is formed such that its end section extends to an intermediate point in the sloped surface section 103a (in a sloped surface of the hill on the opposite side of the laser resonator 102). It is noted that the ring-shaped electrode 104 is in contact with and conductively connected to the upper surface of the laser resonator 102. Also, laser light emitted from the upper surface of the laser resonator 102 passes through an opening section 104a formed in the center of the ring-shaped electrode 104 and is emitted outside. The greater the thickness of the ring-shaped electrode 104 near the opening section 104a, the more the mode of laser light emitted outside is affected. Therefore the ring-shaped electrode 104 needs to be made thinner. On the other hand, in order to inject a current effectively in the laser resonator by reducing the electrical resistance of the ring-shaped electrode 104, the ring-shaped electrode 104 may need to be made thicker. Instead of making the ring-shaped electrode 104 thicker, a thick lead-out electrode 105 is formed on the ring-shaped electrode 104 and the insulation layer 103. The lead-out electrode 105 connects the ring-shaped electrode 104 to a pad electrode (not shown) for applying a driving signal to the laser resonator 102.

When forming the ring-shaped electrode 104 and the lead-out electrode 105, a certain method is used in which the ring-shaped electrode 104 is first formed in appropriate thickness and area, and then the lead-out electrode is formed while avoiding the opening section. Also, each of the ring-shaped electrode and the lead-out electrode is formed through forming a metal film by a vapor deposition method on a resist layer having a predetermined opening configuration, and removing unnecessary portions of the metal film together with the resist by a lift-off method.

It is noted that the optical semiconductor element described above still has the following problems. When the ring-shaped electrode is formed by a lift-off method in a manner that the end section thereof reaches an intermediate point on the slope of the insulation layer on the side away from the laser resonator, the metal film may form a burr at an end of the ring-shaped electrode; and when the lead-out electrode is formed, the lead-out electrode may be disconnected at a position where it overlaps the one end of the ring-shaped electrode (see FIG. 15B). It is believed that, because the end of the ring-shaped electrode has an inversely tapered shape due to the burr, the portion in the inversely tapered shape functions as a mask when the lead-out electrode is formed, thereby causing the disconnection defect. For this reason, disconnection of lead-out electrodes causes to lower the yield in the manufacturing process.

SUMMARY

In accordance with an advantage of some aspects of the present invention, there can be provided electrode structures and optical semiconductor elements that can prevent a reduction in the yield which may be caused by disconnection of lead-out electrodes formed on ring-shaped electrodes.

In accordance with an embodiment of the invention, an electrode structure includes a first conductive layer having an upper surface that exhibits a first conductivity type, a second conductive layer having an upper surface that exhibits a second conductivity type different from the first conductivity type, an insulation layer that covers at least a portion of a marginal area of an upper surface of the first conductive layer and at least a portion of a marginal area of an upper surface of the second conductive layer, and has a sloped section that slopes down toward the upper surface of the first conductive layer, a first electrode having one end formed on the first conductive layer and another end formed on the sloped section, a second electrode formed on the second conductive layer and has a marginal end formed on the insulation layer, a terminal electrode for applying a voltage to the first conductive layer, and a third electrode that is formed on the first electrode, the second electrode and the insulation layer, and connects the first electrode and the terminal electrode through the second electrode.

In accordance with the present embodiment, because one end of the first electrode can be prevented from forming an inversely tapered shape, disconnection of the third electrode formed on the first electrode can be prevented. More specifically, one end section of the first electrode is formed on a portion of the sloped section that slopes down toward the upper surface of the first conductive layer, such that the one end section forms a forward taper shape. As a result, for example, when the first electrode is formed by a lift-off method, generation of burs of the metal material forming the first electrode can be suppressed. Accordingly, disconnection of the third electrode to be formed on the first electrode can be avoided. Therefore, a reduction in the yield during the process of forming the electrode structure can be suppressed.

It is noted here that the first conductive layer and the terminal electrode are connected with each other through the second electrode, and the upper surface of the second conductive layer exhibits a conductivity type different from that of the upper surface of the first conductive layer. The first electrode has a conductivity type of the first conductive layer, which is the first conductivity type. If the first conductive layer and the terminal electrode are connected with each other by the first electrode, and the upper surface of the first conductive layer and the upper surface of the second conductive layer are connected with each other by the first electrode, diffusion may occur between the first electrode and the upper surface of the second conductive layer because the upper surface of the second conductive layer has the second conductivity type that is different from the first conductivity type, which may lead to an unexpected functional reduction of the semiconductor layers. For this reason, it is difficult to directly connect the first electrode to the upper surface of the second conductive layer. Therefore, when the upper surface of the first conductive layer and the terminal electrode are to be conductively connected with each other through the upper surface of the second semiconductor layer, it is necessary to connect them with a third electrode that does not exhibit any conductivity type. According to the present embodiment, disconnection of the third electrode to be provided in such a case as described above can be effectively prevented.

In the electrode structure in accordance with an aspect of the embodiment of the invention, the insulation layer may preferably be formed with another sloped section that slopes down toward the upper surface of the second conductive layer, and the marginal end of the second electrode may preferably be formed on the other sloped section. According to the present embodiment, the marginal end of the second electrode is prevented from forming an inversely tapered shape, like the embodiment described above, whereby disconnection of the third electrode to be formed on the second electrode can be avoided. Therefore, a reduction in the yield during the process of forming the electrode structure can be more securely suppressed.

In accordance with another embodiment of the invention, an electrode structure includes a first columnar structure having an upper surface that exhibits a first conductivity type, a second columnar structure having an upper surface that exhibits a second conductivity type different from the first conductivity type, an insulation layer that covers at least a portion of a marginal area of an upper surface of the first columnar structure and at least a portion of a marginal area of an upper surface of the second columnar structure, and has a sloped section that slopes down toward the upper surface of the first columnar structure, a first electrode having one end formed on the upper surface of the first columnar structure and another end formed on the sloped section, a second electrode formed on the upper surface of the second columnar structure and has a marginal end section formed on the insulation layer, a terminal electrode for applying a voltage to the first columnar structure, and a third electrode that is formed on the first electrode, the second electrode and the insulation layer, and connects the first electrode and the terminal electrode through the second electrode.

In accordance with the present embodiment, one end of the first electrode can be prevented from forming an inversely tapered shape, like the embodiment described above, and disconnection of the third electrode to be formed on the first electrode can be avoided. Furthermore, a reduction in the yield during the process of forming the electrode structure can be suppressed.

It is noted that, if the upper surface of the first columnar structure and the terminal electrode are connected with each other by the first electrode, and the upper surface of the first columnar structure and the upper surface of the second columnar structure are connected with each other by the first electrode, diffusion may occur between the first electrode and the upper surface of the second columnar structure, which may cause unexpected functional deterioration of the columnar structures. For this reason, it is difficult to directly connect the first electrode to the upper surface of the second columnar structure. Therefore, when the upper surface of the first columnar structure and the terminal electrode are to be conductively connected with each other through the upper surface of the second columnar structure, it is necessary to connect them with a third electrode that does not exhibit any conductivity type. According to the present embodiment, disconnection of the third electrode to be provided in such a case as described above can be effectively prevented.

In the electrode structure in accordance with an aspect of the embodiment of the invention, the insulation layer may preferably be formed with another sloped section that slopes down toward the upper surface of the second columnar structure, and the marginal end of the second electrode may preferably be formed on the other sloped section. According to the present embodiment, like the embodiment described above, the marginal end of the second electrode is prevented from forming an inversely tapered shape, whereby disconnection of the third electrode to be formed on the second electrode can be avoided. Therefore, a reduction in the yield during the process of forming the electrode structure can be more securely suppressed.

In accordance with still another embodiment of the invention, an optical semiconductor element includes a laser resonator having a first columnar structure having an upper surface that exhibits a first conductivity type, an additional element having a second columnar structure having an upper surface that exhibits a second conductivity type, an insulation layer that covers at least a portion of a marginal area of an upper surface of the first columnar structure and at least a portion of a marginal area of an upper surface of the second columnar structure, and has a sloped section that slopes down toward the upper surface of the first columnar structure, a first electrode having one end formed on the upper surface of the first columnar structure and another end formed on the sloped section, a second electrode formed on the upper surface of the second columnar structure and has a marginal end section formed on the insulation layer, a terminal electrode for applying a voltage to the laser resonator, and a third electrode that is formed on the first electrode, the second electrode and the insulation layer, and connects the first electrode and the terminal electrode through the second electrode.

In accordance with the present embodiment, one end of the first electrode can be prevented from forming an inversely tapered shape, like the embodiment described above, whereby disconnection of the third electrode to be formed on the first electrode can be avoided. Furthermore, a reduction in the yield in the process of forming the optical semiconductor element can be suppressed.

It is noted that, if the upper surface of the laser resonator and the terminal electrode are connected with each other by the first electrode, and the upper surface of the laser resonator and the upper surface of the additional element are connected with each other by the first electrode, diffusion may occur between the first electrode and the upper surface of the additional element, which may cause unexpected functional deterioration of the additional element. For this reason, it is difficult to directly connect the first electrode to the upper surface of the additional element. Therefore, when the upper surface of the laser resonator and the terminal electrode are to be conductively connected with each other through the upper surface of the additional element, it is necessary to connect them with a third electrode that does not exhibit any conductivity type. According to the present embodiment, disconnection of the third electrode to be provided in such a case as described above can be effectively prevented.

In the optical semiconductor element in accordance with an aspect of the embodiment of the invention, the insulation layer may preferably be formed with another sloped section that gradually slopes down toward the upper surface of the second columnar structure, and the marginal end of the second electrode may preferably be formed on the other sloped section. According to the present embodiment, like the embodiment described above, the marginal end of the second electrode is prevented from forming an inversely tapered shape, whereby disconnection of the third electrode to be formed on the second electrode can be avoided. Therefore, a reduction in the yield in the process of forming the optical semiconductor element can be more securely suppressed.

In the optical semiconductor element in accordance with an aspect of the embodiment of the invention, the additional element may preferably be a rectification element having a rectification action against a reverse bias voltage applied to the laser resonator, and connected in parallel with the laser resonator. According to this embodiment, by connecting the rectification element in parallel with the laser resonator between the terminal electrode and the laser resonator, even when a reverse bias voltage is applied to the terminal electrode, a current caused by the reverse bias voltage does not flow through the laser resonator but flows through the rectification element. For this reason, an electrostatic breakdown voltage of the laser resonator against a reverse bias voltage can be substantially increased.

In the optical semiconductor element in accordance with an aspect of the embodiment of the invention, the laser resonator may preferably be a surface-emitting type semiconductor laser that emits laser light in a direction orthogonal to the upper surface of the first columnar structure. According to this embodiment, the surface-emitting type semiconductor laser is formed, such that a variety of advantages, such as, the capability of direct modulation, operation at low threshold values, and oscillation in a single longitudinal mode can be obtained, and a two-dimensional laser array structure can be more readily formed, compared to an edge-emitting type semiconductor laser having cleavage planes parallel with the substrate.

BRIEF DESCRIPTION OF THE DRAWINGS

FIGS. 11A-11B are cross-sectional views taken along a line C-C of FIG. 10, wherein FIG. 11B is a partially enlarged view of FIG. 11A.

DESCRIPTION OF EXEMPLARY EMBODIMENTS

Figure 1:
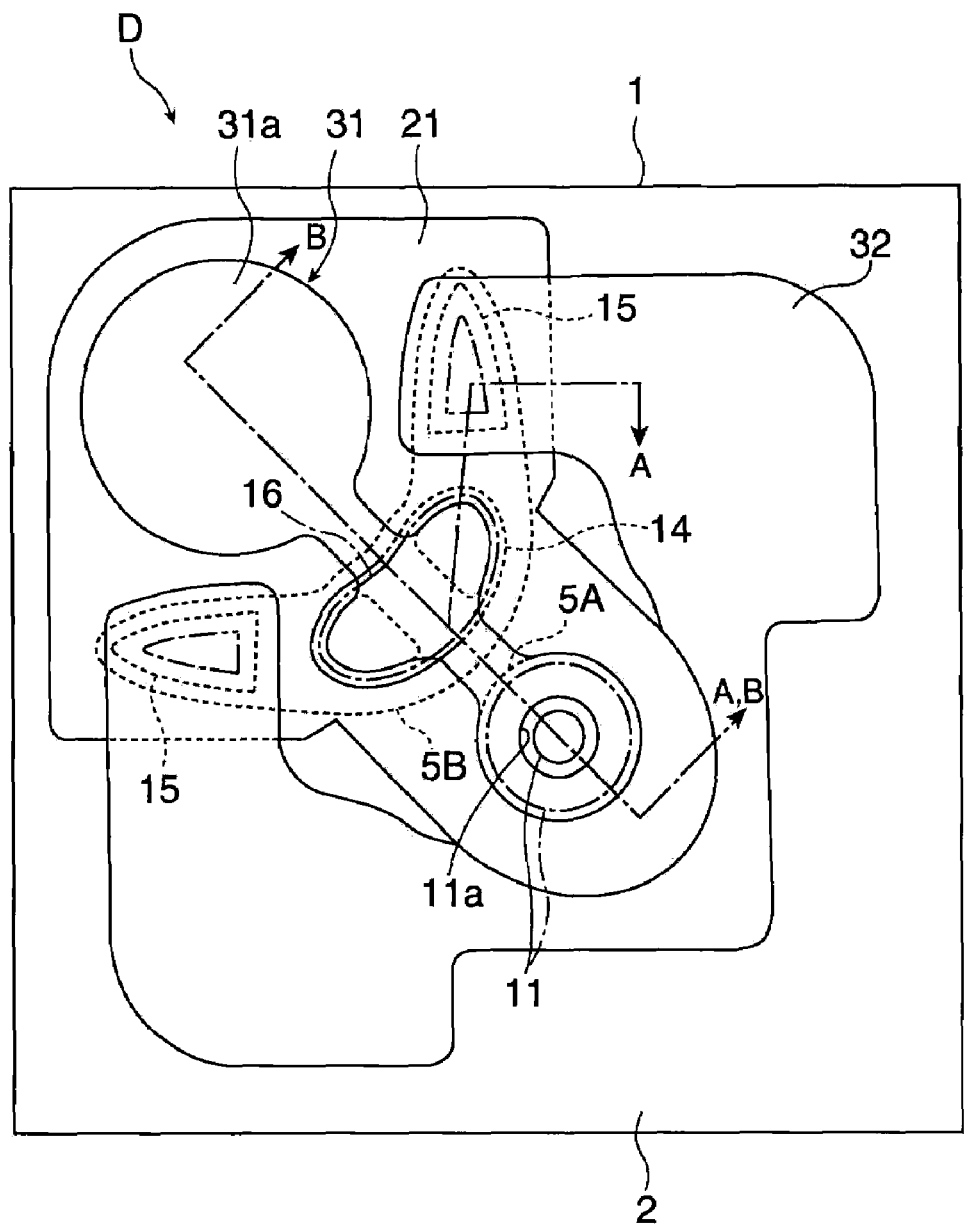
FIG. 1 is a schematic plan view of an optical semiconductor element in accordance with a first embodiment of the invention.

Optical semiconductor elements and electrode structures in accordance with embodiments of the invention are described below. It is noted that, in the drawings referred to below for describing the embodiments, the scale may be changed for each of the layers and each of the members such that the layers and the members have appropriate sizes that can be recognized on the drawings.

First Embodiment

Structure of Optical Semiconductor Element

Figure 2:
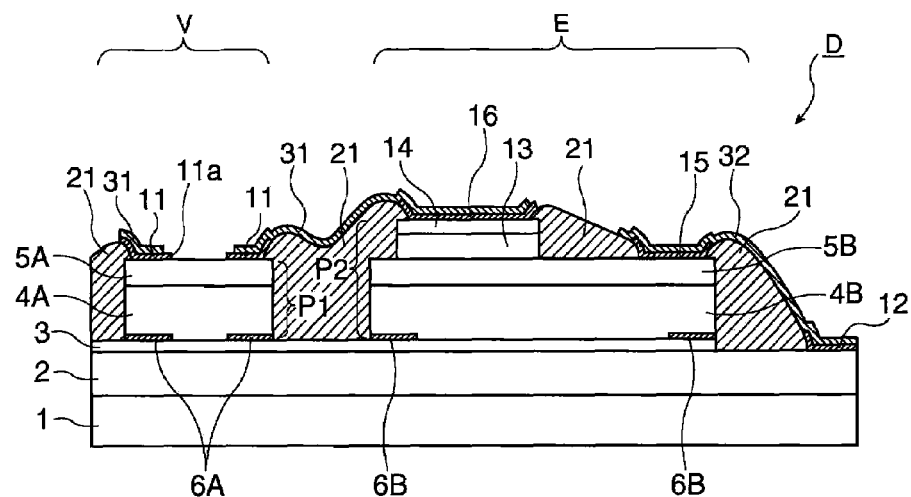
FIG. 2 is a cross-sectional view taken from a line A-A of FIG. 1.
Figure 3:
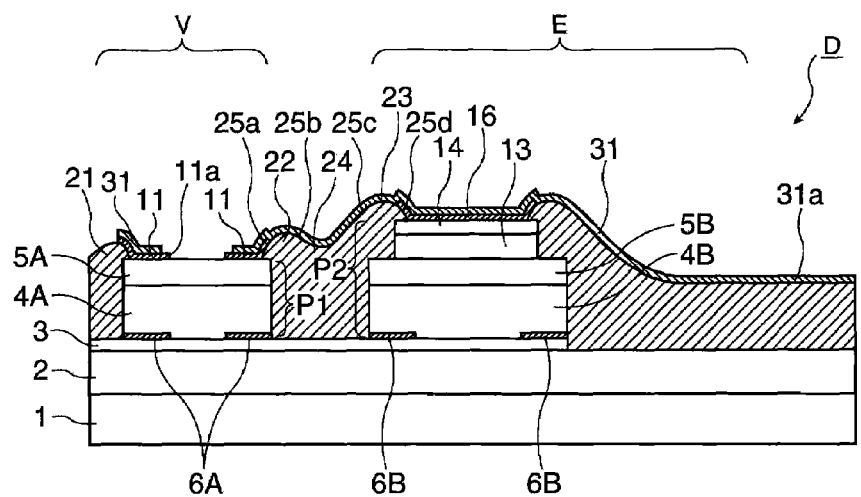
FIG. 3 is a cross-sectional view taken from a line B-B of FIG. 1.
Figure 4:
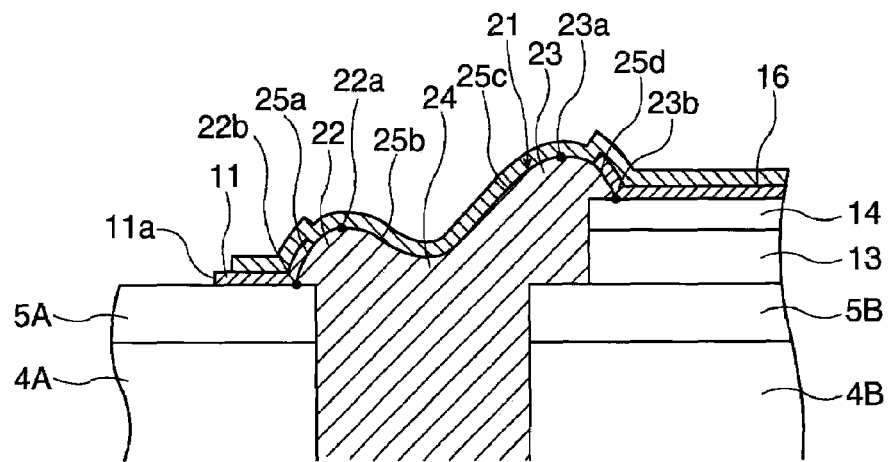
FIG. 4 is an enlarged view in part of FIG. 3.
Figure 5:
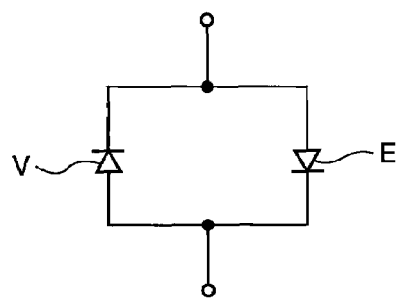
FIG. 5 is an equivalent circuit diagram of the optical semiconductor element of FIG. 1.

First, a first embodiment of the invention is described with reference to the accompanying drawings. FIG. 1 is a schematic plan view of an optical semiconductor element D in accordance with the first embodiment of the invention. FIG. 2 is a cross-sectional view taken along a line A-A of FIG. 1, FIG. 3 is a cross-sectional view taken along a line B-B of FIG. 1, FIG. 4 is a partially enlarged view of FIG. 3, and FIG. 5 is an equivalent circuit diagram of FIG. 1. As shown in FIG. 1 through FIG. 3, the optical semiconductor element D is equipped with a surface-emitting type semiconductor laser V and a rectification diode (additional element) E.

Surface-Emitting Type Semiconductor Laser

As shown in FIG. 1 through FIG. 3, the surface-emitting type semiconductor laser V is formed on a substrate 1, for example, a semiconductor substrate composed of n-type GaAs. The surface-emitting type semiconductor laser V has a vertical resonator, wherein one of distributed reflection type multilayer mirrors composing the vertical resonator is formed in a first columnar section (first columnar structure) P1. In other words, the surface-emitting type semiconductor laser V has a structure in which a portion thereof is included in the first columnar section P1.

The surface-emitting type semiconductor laser V has a multilayer structure in which a first mirror layer 2, an active layer 3, a second mirror layer 4A and a contact layer (first conductive layer) 5A are sequentially laminated. The first mirror layer 2 is a distributed reflection type multilayer mirror of 40 pairs of alternately laminated n-type $Al_{0.9}Ga_{0.1}As$ layers and n-type $Al_{0.15}Ga_{0.85}As$ layers, and is made to be n-type by doping, for example, silicon (Si). The active layer 3 is composed of, for example, GaAs well layers and $Al_{0.3}Ga_{0.7}As$ barrier layers in which the well layers include a quantum well structure composed of three layers. The second mirror layer 4A is, for example, a distributed reflection type multilayer mirror of 25 pairs of alternately laminated p-type $Al_{0.9}Ga_{0.1}As$ layers and p-type $Al_{0.15}Ga_{0.85}As$ layers, and is made to be p-type by doping, for example, carbon (C). The contact layer 5A is composed of, for example, p-type GaAs, and is made to be p-type (first conductivity type) by doping C.

Further, the surface-emitting type semiconductor laser V is provided with a first columnar section P1 formed by etching the second mirror layer 4A and the contact layer 5A in a circular shape as viewed in a plan view. A current constricting layer 6A, formed by oxidizing the AlGaAs layer from a side surface of the first columnar section P1, is provided in a region near the active layer 3 among the layers composing the second mirror layer 4A. Also, the surface-emitting type semiconductor laser V has an electrode (first electrode) 11 in a ring shape as viewed in a plan view formed on the contact layer 5A, and an electrode 12 formed on the first mirror layer 2.

The electrode 11 is formed generally concentric with the first columnar section P1. Further, as shown in FIG. 3 and FIG. 4, the electrode 11 has one end that contacts the contact layer 5A and the other end formed on a sloped section 25a of an insulation layer 21 to be described below. An opening section 11a is formed in the central section of the electrode 11, and a surface of the contact layer 5A exposed through the opening section 11a defines an emission surface of the surface-emitting type semiconductor laser V. It is noted that the electrode 11 is composed of gold (Au) and zinc (Zn). By using Au and Zn for the electrode 11, the electrode 11 can form good ohmic contact with the contact layer 5A. Also, one end of the electrode 12 is formed on the insulation layer 21 to be described below, like the electrode 11.

Rectification Diode

As shown in FIG. 1 through FIG. 3, the rectification diode E is formed on the substrate 1, and is composed of a columnar section (second columnar structure) P2 formed in a columnar shape at a position different from the position where the first columnar section P1 is formed. The rectification diode E, like the surface-emitting type semiconductor laser V, has a multilayer structure in which a first mirror layer 2, an active layer 3, a second mirror layer 4B and a contact layer 5B are sequentially laminated, and an i-type semiconductor layer 13 and an n-type semiconductor layer (second semiconductor layer) 14 are further laminated on the contact layer 5B. The i-type semiconductor layer 13 is composed of a GaAs layer in which no impurity is introduced. The n-type semiconductor layer 14 is composed of an n-type GaAs layer that is made to be n-type (second conductivity type) by doping, for example, Si.

Further, the rectification diode E is provided with the second columnar section P2 that is formed by etching the second mirror layer 4B and the contact layer 5B in a generally L-letter shape as viewed in a plan view, and etching the i-type semiconductor layer 13 and the n-type semiconductor layer 14 in a generally oval shape as viewed in a plan view. Also, an oxide layer 6B is formed in a region near the active layer 3 among the layers composing the second mirror layer 4B. Further, the rectification diode E has an electrode 15 formed on the contact layer 5B, and an electrode (second electrode) 16 formed on the n-type semiconductor layer 14. The electrode 15 is composed of Au and Zn, like the electrode 11, and has a marginal section formed on the insulation layer 21 to be described below. The electrode 16 has one end shown in FIG. 3 and FIG. 4 formed on a sloped section 25d of the insulation layer 21 to be described below, and the other end formed on the insulation layer 21 to be described below provided on the contact layer 5B. The electrode 16 is formed from Au and germanium (Ge). By using Au and Ge as the electrode 16, the electrode 16 can form good ohmic contact with the n-type semiconductor layer 14. The contact layer SB, the i-type semiconductor layer 13 and the n-type semiconductor layer 14 form a pin diode, which forms the rectification diode E.

Insulation Layer

An insulation layer 21 composed of, for example, polyimide resin is formed on the active layer 3, the first mirror layer 2 and the contact layer 5B in a manner to surround the circumferences of the first and second columnar sections P1 and P2. The insulation layer 21 is formed in a manner to cover at least a portion of the marginal end section of the contact layer 5A composing the first columnar section P1. Also, the insulation layer 21 is formed in a manner to cover at least a portion of the marginal end section of the n-type semiconductor layer 14 composing the second columnar section P2. Further, the insulation layer 21 is formed in a manner to cover the marginal end section of the contact layer 5B composing the second columnar section P2 along its entire circumference.

It is noted that the insulation layer 21 may preferably cover the upper surface of each of the first and second columnar sections P1 and P2 from its edge section toward its center by at least 1 µm or more. However, to what extent the insulation layer 21 should cover may need to be decided in consideration of the area of the emission surface of the surface-emitting type semiconductor laser V, a contact area between the electrode 11 and the contact layer 5A, and the like. Also, the insulation layer 21 may preferably cover the marginal end section of the contact layer 5A along its entire circumference. Similarly, the insulation layer 21 may preferably cover the marginal end section of the conductive layer 14 along its entire circumference. By this, even when the insulation layer 21 expands or contracts during the manufacturing process, loads caused by the expansion or contraction of the insulation layer 21 are evenly applied between the first columnar section P1 or the second columnar section P2 and the insulation layer 21. Therefore the adhesion strength between the first columnar section P1 or the second columnar section P2 and the insulation layer 21 can be maintained.

Also, as shown in FIG. 3, in the insulation layer 21 between the first columnar section P1 and the second columnar section P2, a concave section 24 is formed by a hill section 22 formed on the side of the first columnar section P1 and a hill section 23 formed on the side of the second columnar section P2. Therefore, the insulation layer 21 is formed with a sloped section 25a between the hill section 22 and an edge section of the first columnar section P1, a sloped section (another sloped section) 25b between the hill section 22 and the concave section 24, a sloped section 25c between the concave section 24 and the hill section 23, and a sloped section (another sloped section) 25d between the hill section 23 and an edge section of the second columnar section P2.

The sloped sections 25a and 25c have an inclination that slopes down toward the first columnar section P1. Also, the sloped section 25b and 25d have an inclination that slopes up toward the first columnar section P1. In other words, the sloped section 25b and 25d have an inclination that slopes down toward the upper surface of the second columnar section P2. Furthermore, the one end of the electrode 11 described above is formed on the sloped section 25a, as shown in FIG. 3 and FIG. 4. In other words, the one end of the electrode 11 is formed on the sloped section 25a that gradually slopes down toward the upper surface of the contact layer 5A between an apex 22a of the hill section 22 and a lowest point 22b of the hill section 22 on the side of the first columnar section P1. Also, the end of the electrode 16 described above is formed on the sloped section 25d that gradually slopes down toward the upper surface of the n-type semiconductor layer 14 between an apex 23a of the hill section 23 and a lowest point 23b of the hill section 23 on the side of the second columnar section P2. In other words, the one end of the electrode 16 is formed on the sloped section 25d that gradually slopes down toward the upper surface of the n-type semiconductor layer 14. It is noted that the one end of the electrode 11 only needs to be formed on a sloped section that slopes down toward the upper surface of the contact layer 5A, and may be on the sloped section 25c. Similarly, the one end of the electrode 16 only needs to be formed on a sloped section that slopes down toward the upper surface of the n-type semiconductor layer 14, and may be on the sloped section 25b.

Electrode Wiring

As shown in FIG. 1 through FIG. 3, a wiring (third electrode) 31 that conductively connects the electrode 11 and the electrode 16, and a wiring 32 that conductively connects the electrode 12 and the electrode 15 are formed on the insulation layer 21. It is noted that the electrode 11 and the electrode 16 are connected with each other through the wiring 31 for the reason described below. In other words, the upper surface of the first columnar section P1 (the contact layer 5A) exhibits p-type, and the upper surface of the second columnar section P2 (the n-type semiconductor layer 14) exhibits n-type. Further, the electrode 11 exhibits p-type as it is in contact with the contact layer 5A, and the electrode 16 exhibits n-type as it is in contact with the n-type semiconductor layer 14. Therefore, it is difficult to contact the electrode 11 directly with the n-type semiconductor layer 14, as diffusion may occur in each of them. For the reason described above, the electrode 11 and the electrode 16 need to be connected with each other through the wiring 31. As described above, because the electrode 11 and the electrode 16 have mutually different conductivity types, the electrode 11 and the electrode 16 may preferably be separated from each other by, for example, 15 μm or more, in order to suppress the effect of diffusion. Similarly, any two of the electrodes 11, 12, 15 and 16 that have mutually different conductivity types may preferably be formed, separated from each other by, for example, 15 μm or more.

The wiring 31 covers a marginal end section of the electrode 11 and is formed on the hill section 22, the concave section 24 and the hill section 23 of the insulation layer 21, as shown in FIG. 3, thereby connecting the electrode 11 and the electrode 16 with each other. It is noted that the wiring 31 is formed, receded from an edge of the opening section 11a of the electrode 11 by a certain offset amount so as not to interfere with laser light emitted from the opening section 11a of the electrode 11. A connection area of the wiring 31 and the electrode 11 may preferably be in a ring-shape, and the connection area may preferably be generally concentric with the opening section 11a. As a result, the light emitted from the opening section 11a is formed to be a laser beam in a circular shape with a very small expansion angle. Furthermore, a pad section (terminal electrode) 31a for applying a driving signal to the surface-emitting type semiconductor laser is formed at one end of the wiring 31. It is noted that the wirings 31 and 32 provide only the function to lead the electrodes 11, 12, 15 and 16 into a broader area. Therefore, the material that composes the wirings 31 and 32 requires no consideration of compatibility in ohmic contact with semiconductor material, and tenacious material strongly resistive to line-breakage, in other words, ductile material such as Au alone or the like can be used. The use of tenacious material strongly resistive to line-breakage as the material of the wirings 31 and 32 can contribute to prevention of occurrence of line-breakage or disconnection.

In the optical semiconductor element D having the structure described above, the electrode 11 and the electrode 16 are connected with each other by the wiring 31, and the electrode 12 and the electrode 15 are connected with each other by the wiring 32, whereby, as shown in FIG. 5, the surface-emitting type semiconductor laser V and the rectification diode E are connected in parallel with each other.

Method for Manufacturing Optical Semiconductor Element Next, a method for manufacturing the optical semiconductor element D in accordance with the present embodiment is described. FIG. 6 through FIG. 9 are process drawings showing the steps of manufacturing the optical semiconductor element D. It is noted that these process drawings correspond to the cross-sectional view shown in FIG. 2.

Figure 6A:
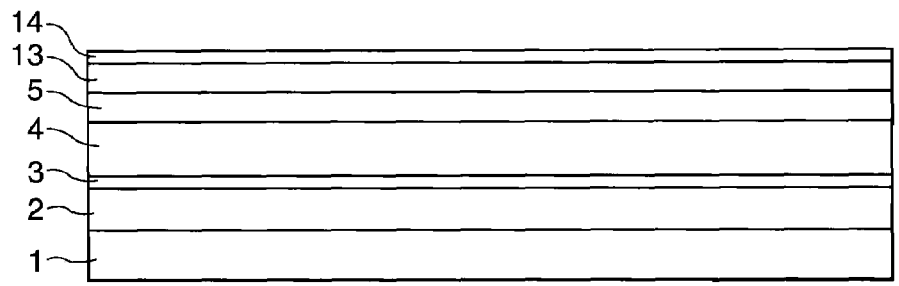
FIGS. 6A-6C are cross-sectional views schematically showing steps of manufacturing the optical semiconductor element of FIG. 1.

First, on a substrate 1 composed of an n-type GaAs layer, a first mirror layer 2, an active layer 3, a second mirror layer 4, a contact layer 5, an i-type semiconductor layer 13 and an n-type semiconductor layer 14 are formed by epitaxial growth while modifying its composition (see FIG. 6A). It is noted that, when the second mirror layer 4 is grown, at least one layer thereof near the active layer 3 is formed to be an AlAs layer or an AlGaAs layer with an Al composition being 0.95 or greater. This layer is later oxidized in a step to be described below, and becomes to function as a current constricting layer 6A. Also, by providing the contact layer 5, the electrode 11 and the electrode 15 can readily form an ohmic contact.

In this case, the first mirror layer 2 is composed of a distributed reflection type multilayer mirror of 40 pairs of alternately laminated n-type $Al_{0.9}Ga_{0.1}As$ layers and n-type $Al_{0.15}Ga_{0.85}As$ layers, the active layer 3 is composed of $Al_{0.3}Ga_{0.7}As$ barrier layers including a quantum well structure formed with three layers of GaAs well layers, and the second mirror layer 4 is composed of a distributed reflection type multilayer mirror of 25 pairs of alternately laminated p-type $Al_{0.9}Ga_{0.1}As$ layers and p-type $Al_{0.15}Ga_{0.85}As$ layers.

The temperature at which the epitaxial growth is conducted is appropriately decided depending on the growth method, the kind of raw material, the type of the semiconductor substrate 1, and the kind, thickness and carrier density of the semiconductor layers to be formed, and may preferably be set generally at 450° C.-800° C. Also, the time required for conducting the epitaxial growth is appropriately decided like the temperature. A metal-organic vapor phase growth method, a MBE (Molecular Beam Epitaxy) method, a LPE (Liquid Phase Epitaxy) method or the like can be used as a method for the epitaxial growth.

Figure 6B:
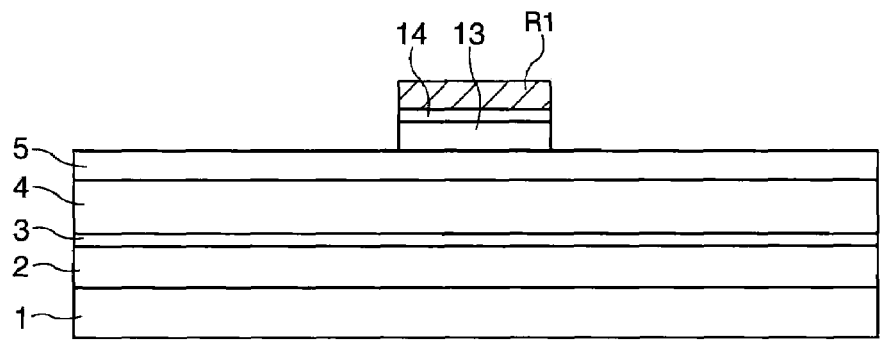

Next, the i-type semiconductor layer 13 and the n-type semiconductor layer 14 are patterned (see FIG. 6B). In this step, resist is coated on the n-type semiconductor layer 14, and the resist is patterned, thereby forming a resist layer R1 having an opening section in a predetermined pattern. Then by using the resist layer R1 as a mask, etching (for example, dry etching or wet etching) is conducted to form the i-type semiconductor layer 13 and the n-type semiconductor layer 14 in a predetermined pattern.

Figure 6C:
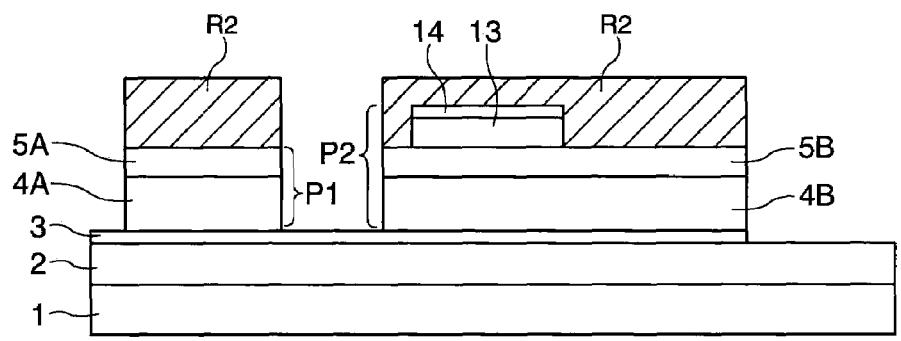

Then, the second mirror layer 4 and the contact layer 5 are patterned (see FIG. 6C). In this step, a resist layer R2 having an opening section in a predetermined pattern is formed in a similar manner as described above. Then by using the resist layer R2 as a mask, etching is conducted to form second mirror layers 4A and 4B and contact layers 5A and 5B each having a predetermined pattern. A first columnar section P1 is formed with the second mirror layer 4A and the contact layer 5A.

Figure 7A:
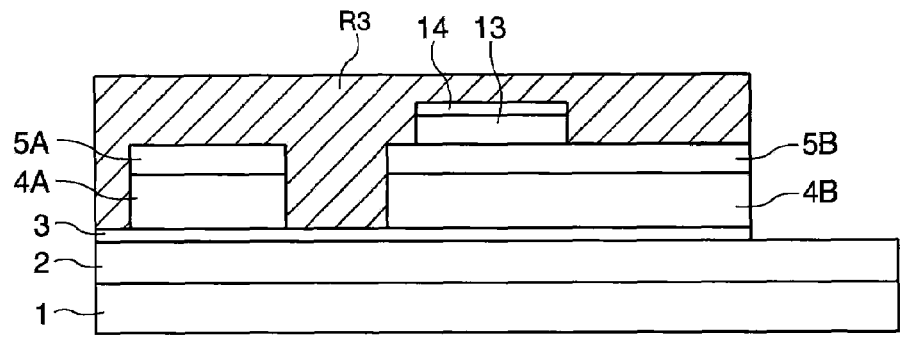
FIGS. 7A-7C are cross-sectional views schematically showing steps of manufacturing the optical semiconductor element of FIG. 1.

Then, a portion of the surface of the first mirror layer 2 is exposed (see FIG. 7A). In this step, a resist layer R3 having an opening section in a predetermined pattern is formed in a similar manner as described above. Then by using the resist layer R3 as a mask, etching is conducted to etch a portion of the active layer 3, thereby exposing a portion of the surface of the first mirror layer 2. The order of the patterning steps is not limited to the above. Also, the active layer 3 may be patterned and separated concurrently with patterning of the second mirror layer 4 and the contact layer 5, in plane configurations similar to the patterns of the second mirror layer 4 and the contact layer 5. In this case, a portion of the surface of the first mirror layer 2 is exposed, and therefore the steps of forming the resist layer R3 and etching a portion of the active layer 3 become unnecessary.

Figure 7B:
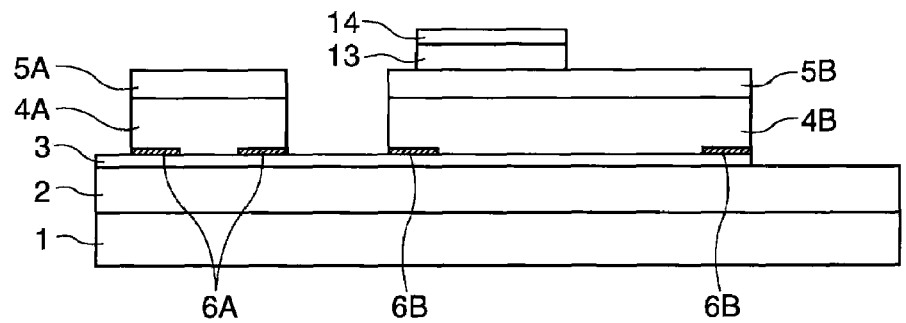
Figure 7C:
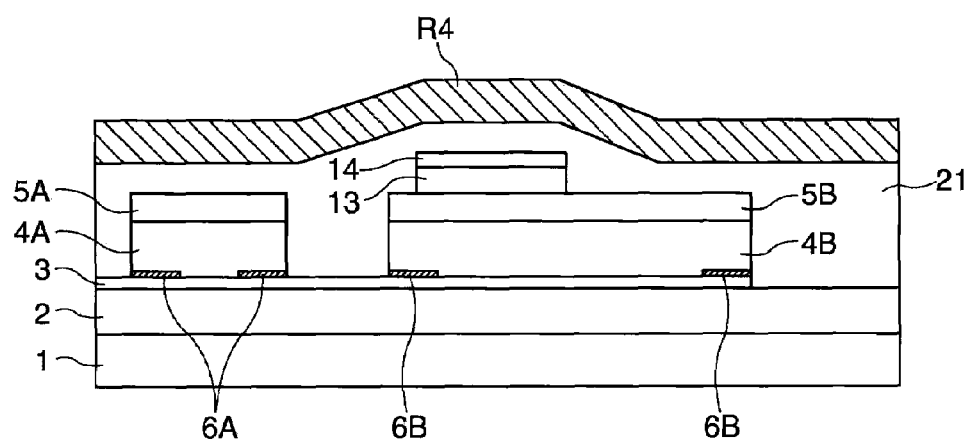

Next, a current constricting layer 6A is formed (see FIG. 7B). In this step, the substrate 1 on which the layers are formed is placed in a water vapor atmosphere at, for example, about 400° C., whereby, at least one layer in the second mirror layer 4A near the active layer 3, which has been formed as an AlAs layer or an AlGaAs layer with an Al composition being 0.95 or higher, is oxidized from its side surface. By this step, the current constricting layer 6A is formed. At this time, at least one layer in the second mirror layer 4B near the active layer 3 is concurrently oxidized, whereby an oxide layer 6B is formed.

Then, an insulation layer 21 composed of polyimide resin is formed. In this step, first, polyimide resin is coated around the first columnar section P1 and the second columnar section P2 and on upper surfaces of the layers formed on the substrate 1 by, for example, a spin coat method to thereby form the insulation layer 21. Then, a resist layer R4 composed of photosensitive resist is formed on the insulation layer 21 (see FIG. 7C). The resist layer R4 may be composed of positive type resist whose dissolubility at portions thereof irradiated with light energy increases. Also, the insulation layer 21 may be formed by a dipping method, a spray coat method, a droplet discharge method (for example, an ink jet method) or the like, instead of the spin coat method. Furthermore, the insulation layer 21 may be pre-baked, for example, at about 80-100° C., thereby evaporating the solvent in the insulation layer 21. By so doing, the dissolving rate of the insulation layer 21 can be made lower than that of the resist layer R4.

Figure 8A:
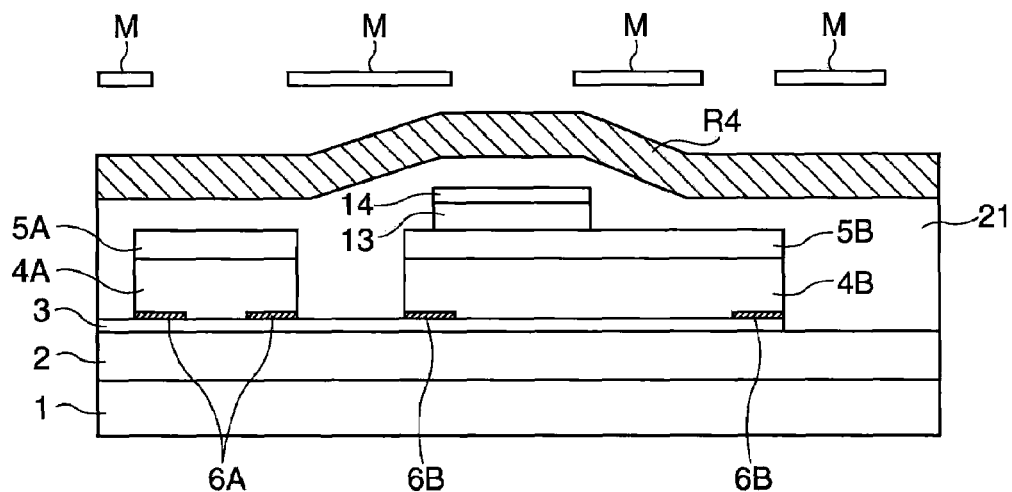
FIGS. 8A-8B are cross-sectional views schematically showing steps of manufacturing the optical semiconductor element of FIG. 1.
Figure 8B:
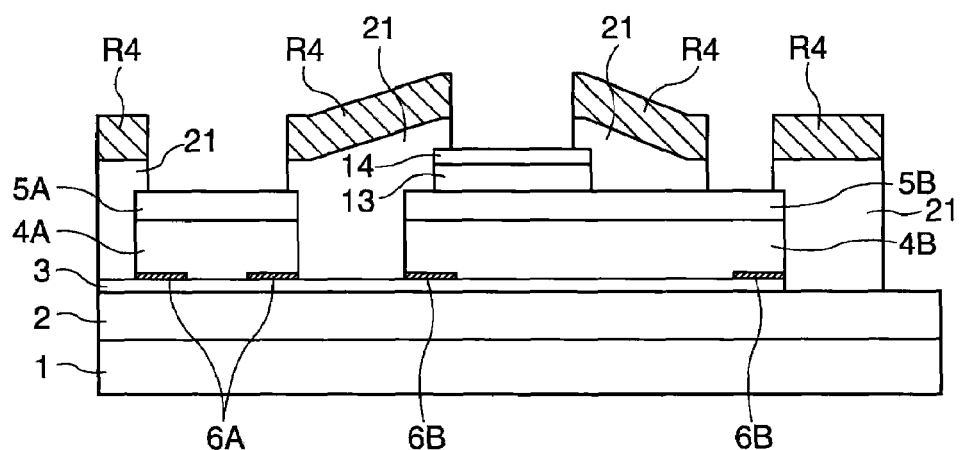

Then, the resist layer R4 is exposed and developed by using a photolithography technique (see FIG. 8A). In this step, a mask M is disposed in a manner that central sections of the upper surface of the first columnar section P1, the upper surface of an electrode 16, the upper surface of an electrode 15 and the upper surface of an electrode 12 to be formed are opened. Light energy is irradiated to the resist layer R4 through the mask M, whereby the resist layer R4 and the insulation layer 21 are exposed and developed together, and the insulation layer 21 is patterned. In this manner, the central sections of the upper surface of the first columnar section P1, the upper surface of the electrode 16, the upper surface of the electrode 15 and the upper surface of the electrode 12 can be exposed, and the resist layer R4 and the insulation layer 21 are formed in a manner to cover marginal areas of these upper surfaces (see FIG. 8B). In this embodiment, a single mask M is used for the patterning. However, the patterning may be conducted with a plurality of masks depending on a pattern configuration. By developing and exposing with each of the plurality of masks, optimum exposure time and developing time can be secured for each event, and the pattern configuration can be optimized.

Figure 9A:
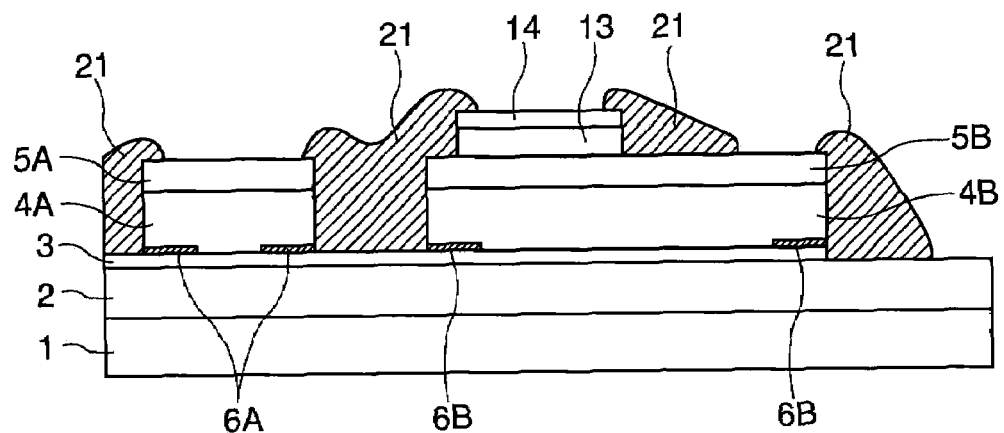
FIGS. 9A-9B are cross-sectional views schematically showing steps of manufacturing the optical semiconductor element of FIG. 1.

Then, the resist layer R4 is removed (see FIG. 9A). In this step, resist thinner or the like is used to dissolve and remove (wet-etch) the resist layer R4. In this case, by using the difference in dissolving rate between the resist layer R4 and the pre-baked insulation layer 21, the entire resist layer R4 and a surface portion of the insulation layer 21 are removed. At this time, the surface portion of the insulation layer 21 together with the resist layer R4 are removed, such that the surface of the insulation layer 21 can be formed into a smooth curved surface. Then, the insulation layer 21 is hardened by heating at, for example, about 350° C. It is noted that the insulation layer 21 may be patterned by using a wet-etching method (a dissolving and removal method). The wet etching step may be a wet developing step of a photolithography technique. Before the wet etching step, the insulation layer 21 may be pre-baked, for example, at about 80-100° C., thereby evaporating the solvent in the insulation layer 21. By so doing, the dissolving rate at the time of wet etching can be made uniform.

It is noted that, in the present embodiment, the end surface of the insulation layer 21 at each of the opening sections is illustrated as a vertical surface in order to facilitate visual recognition, but may be formed with a gently sloped surface by appropriately modifying the aforementioned upper surfaces to be patterned. By forming the end surface of the insulation layer 21 with a gently sloped surface, bent and disconnection of wirings 31 and 32 to be formed on the upper surfaces can be prevented. On the other hand, by forming the end surface of the insulation layer 21 with a vertical surface, accuracy in the design calculation of contact areas of the wirings 31 and 32, electrodes 11, 12, 15 and 16 can be improved.

Figure 9B:
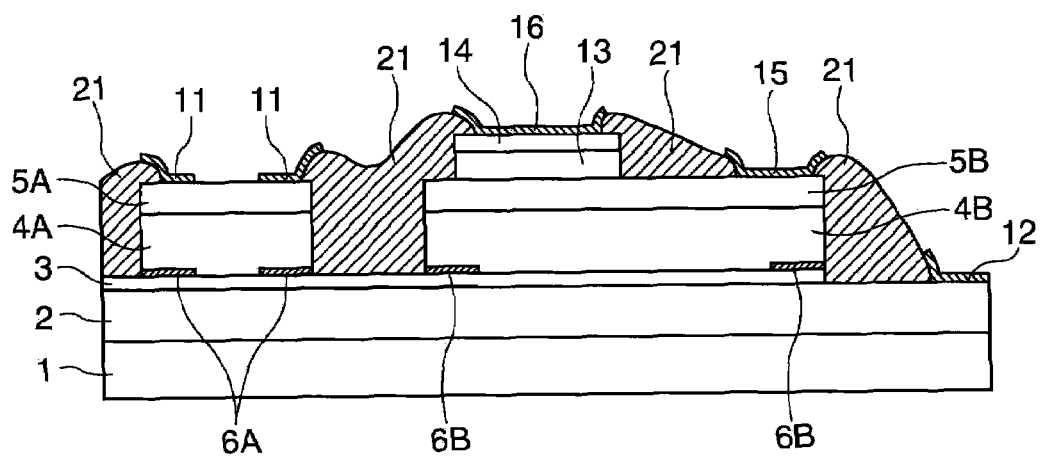

Next, an electrode 11, an electrode 12, an electrode 15 and an electrode 16 each having a predetermined pattern are formed on the patterned insulation layer 21 by a photolithography method (see FIG. 9B). Further, wirings 31 and 32 are formed (see FIG. 2). It is noted that, before forming each of the electrodes, an area where the corresponding electrode is to be formed may be washed by plasma processing if necessary. Also, as a method for forming the electrodes, for example, at least one layer of conductive material may be formed by a vacuum deposition method, and then, portions of the conductive layer may be removed by a lift-off method. It is noted that a dry etching method may be used instead of the lift-off method.

Operation of Optical Element

General operations of the optical semiconductor element D having the structure described above are described. It is noted that the following driving method is described as an example, and various changes can be made within the scope of the invention. First, when a voltage in a forward direction is applied to the pin diode composed of the second mirror layer 4A, the active layer 3 and the first mirror layer 2 through the wiring 31 and the electrode 12 that are connected to a power supply (not shown), recombination of electrons and holes occur in the active layer 3 of the surface-emitting type semiconductor laser V, thereby causing emission of light due to the recombination. Stimulated emission occurs during the period the generated light reciprocates between the second mirror 4A and the first mirror 2, whereby the light intensity is amplified. When the optical gain exceeds the optical loss, laser oscillation occurs, whereby laser light is emitted from the opening section 11a.

When a voltage in a forward direction is applied to the pin diode on the side of the surface-emitting type semiconductor laser V, a reverse bias voltage is applied to the rectification diode E that is the pin diode composed of the contact layer 5B, the i-type semiconductor layer 13 and the n-type semiconductor layer 14, and therefore no current flows through the rectification diode E. However, when a reverse bias voltage, which may be caused by unexpected serge current by the driving circuit, static electricity generated in handling, or the like, is applied to the pin diode on the side of the surface-emitting type semiconductor laser V, in other words, when a voltage in a forward direction is applied to the rectification diode E, a current flows through the rectification diode E, such that destruction of the surface-emitting type semiconductor laser V by the reverse bias voltage can be prevented.

According to the electrode structure and the optical semiconductor element D in accordance with the present embodiment, one end of the electrode 11 is formed on the sloped section 25a that gradually slopes down toward the upper surface of the first columnar section P1 (the contact layer 5A). As a result, the one end of the electrode 11 is prevented from forming an inversely tapered shape, and disconnection of the wiring 31 can be avoided. Accordingly, the yield in the process of manufacturing the optical semiconductor element D can be prevented from lowering. Also, one end of the electrode 16 is formed on the sloped section 25d that gradually slopes down toward the upper surface of the second columnar section P2 (the n-type semiconductor layer 14). As a result, the one end of the electrode 16 is prevented from forming an inversely tapered shape, and therefore disconnection of the wiring 31 can be avoided. Accordingly, the yield in the process of manufacturing the optical semiconductor element D can be more securely prevented from lowering. Further, in the optical semiconductor element E in accordance with the present embodiment, the rectification diode E is connected in parallel with the surface-emitting type semiconductor laser V between the pad section 31a and the surface-emitting type semiconductor laser V, such that, even when a reverse bias voltage is applied to the pad section 31a, a current caused by the reverse bias voltage does not flow through the surface-emitting type semiconductor laser V but flows through the rectification diode E. For this reason, an electrostatic breakdown voltage of the surface-emitting type semiconductor laser V against a reverse bias voltage can be substantially increased.

Second Embodiment

Structure of Optical Semiconductor Element

Figure 10:
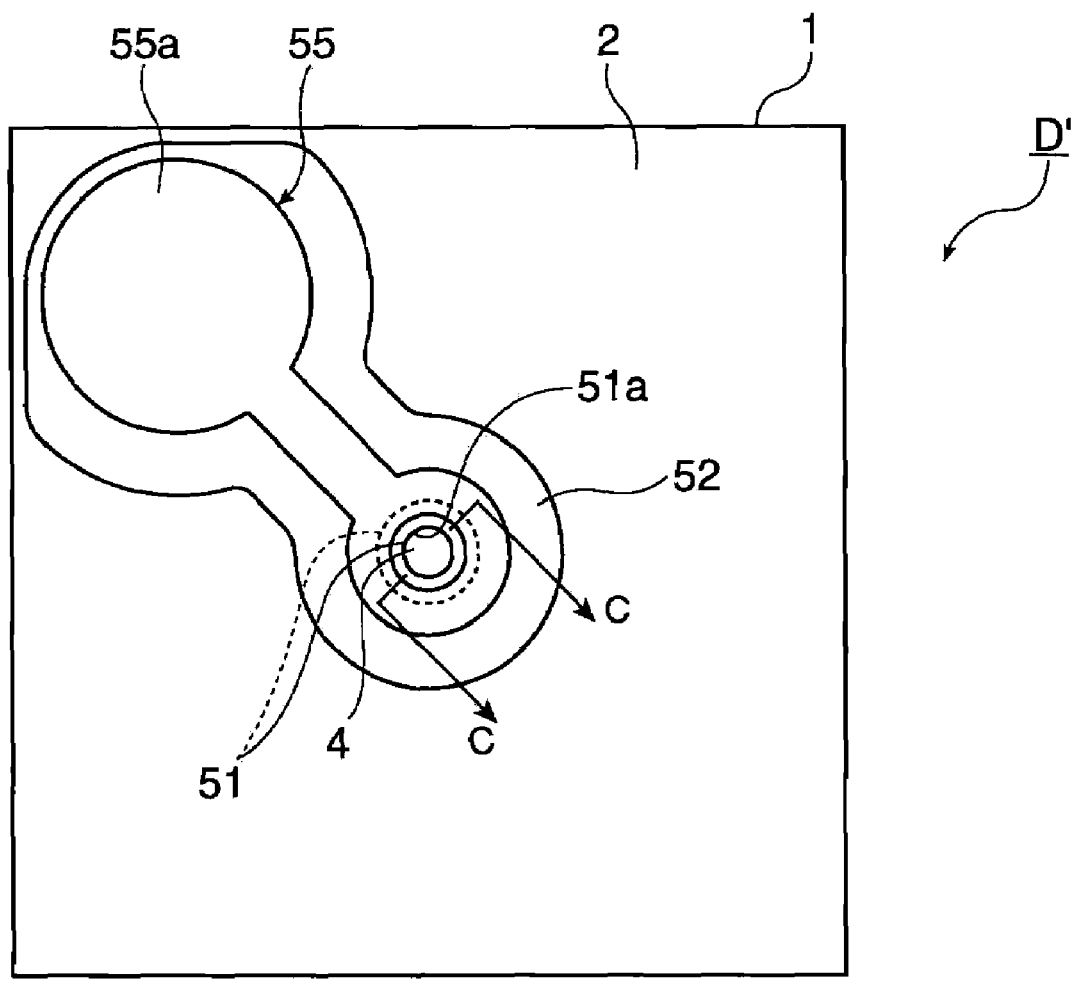
FIG. 10 is a schematic plan view of an optical semiconductor element in accordance with a second embodiment of the invention.
Figure 11A:
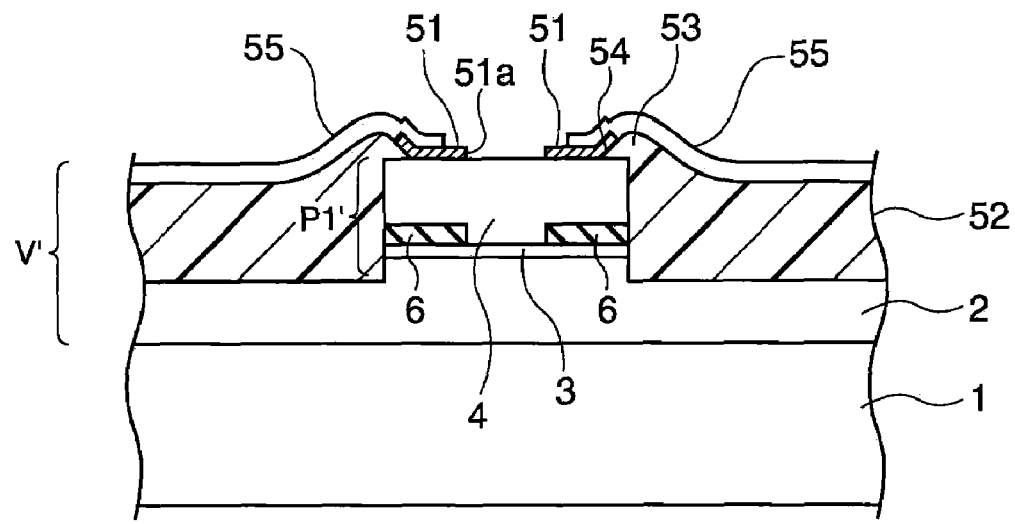
Figure 11B:
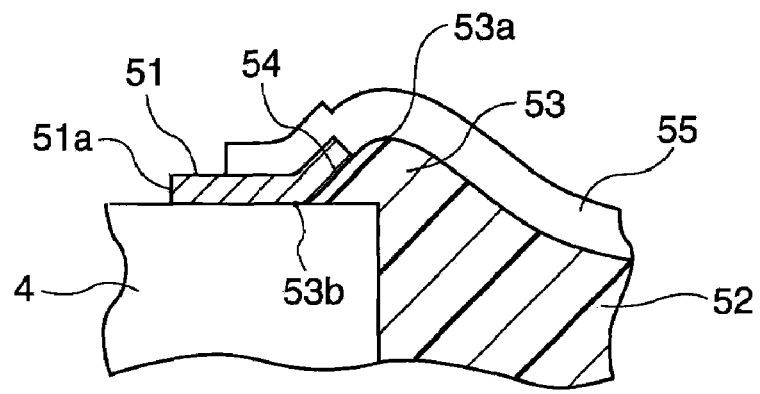

Next, a second embodiment of the invention is described with reference to the accompanying drawings. In the following description, components that are the same as those described above in the first embodiment are appended with the same reference numbers, and their description is omitted. FIG. 10 is a schematic plan view of an optical semiconductor element D', FIG. 11A is a cross-sectional view taken along a line C-C of FIG. 10, and FIG. 11B is a partially enlarged view of FIG. 11A. The second embodiment is different from the first embodiment in that the optical semiconductor element D' of the second embodiment is composed of a surface-emitting type semiconductor laser V' alone.

The surface-emitting type semiconductor laser V' has a multilayer structure in which a first mirror layer 2, an active layer 3 and a second mirror layer 4 are sequentially laminated, thereby forming a first columnar section P1' that composes an optical resonator. Also, a current constricting layer 6, formed by oxidizing an AlGaAs layer from a side surface of the first columnar section P1', is provided in a region near the active layer 3 among the layers composing the second mirror layer 4.

The surface-emitting type semiconductor laser V' has an electrode 51 in a ring shape as viewed in a plan view formed on the upper surface of the second mirror layer 4, and an electrode (not shown) formed on the back surface of the substrate 1. The electrode 51 is formed generally concentric with the first columnar section P1'. Further, as shown in FIG. 11, the electrode 51 has one end that contacts the second mirror layer 4 and the other end formed on an insulation layer 52 to be described below. An opening section 51a is formed in the central section of the electrode 51, and a surface of the second mirror layer 4 exposed through the opening section 51a defines an emission surface of the surface-emitting type semiconductor laser V'.

The electrode 51 does not need to be formed with a mechanically strong material (for example, ductile material strongly resistive to line-breakage) or structure, as long as it has a function to form ohmic contact with the second mirror layer 4. Accordingly, the electrode 51 may be formed from Au and Zn, or Au and Ge. When the material composed of Au and Zn is used as the electrode 51, the electrode 51 can form good ohmic contact when the second mirror layer 4 is composed of p-type semiconductor. When the material composed of Au and Ge is used as the electrode 51, the electrode 51 can form good ohmic contact when the second mirror layer 4 is composed of n-type semiconductor. In the latter case, the electrode 51 functions as a cathode electrode.

Also, the electrode 51 may be formed from titanium (Ti) and gold (Au) successively laminated in layers, or titanium (Ti), platinum (Pt) and gold (Au) successively laminated in layers. In this case, the electrode 51 that is in ohmic contact with the semiconductor composing a portion of the first columnar section P1' can be formed without conducting an anneal treatment. In this instance, the carrier density on the semiconductor side needs to be about $1\times10^{19}(cm^{-3})$ or more for achieving an ohmic contact.

An insulation layer 52 composed of, for example, polyimide resin is formed on the first mirror layer 2 in a manner to cover the circumference and a marginal portion of an upper surface of the first columnar section P1'. The insulation layer 52 has a hill section 53 having a gentle slope 54 in a region near the marginal portion of the first columnar section P1', which is gradually planarized with a gentle slope as it is separated away from the first columnar section P1'. It is noted that the insulation layer 52 may preferably cover the upper surface of the first columnar section P1' from its edge section toward its center by at least 1 μm or more. However, to what extent the insulation layer 52 should cover may need to be decided in consideration of the area of the emission surface of the surface-emitting type semiconductor laser V', a contact area between the electrode 51 and the second mirror layer 4, and the like.

Furthermore, a wiring 55 that is connected to the electrode 51 is formed on the insulation layer 52, as shown in FIG. 10 and FIG. 11. It is noted that the wiring 55 is formed, receded from an edge of the opening section 51a of the electrode 51 by a certain offset amount so as not to interfere with laser light emitted from the opening section 51a of the electrode 51. A connection area of the wiring 55 and the electrode 51 may preferably be in a ring-shape, and the connection area may preferably be generally concentric with the opening section 51a. As a result, the light emitted from the opening section 51a is formed to be a laser beam in a circular shape with a very small expansion angle. And pad section 55a is formed opposite side from the electrode 51 on the wiring 55.

It is noted that the wiring 55 provides only the function to lead the minute electrode 51 into a broader area. Therefore, the material that composes the wiring 55 requires no consideration of compatibility in ohmic contact with semiconductor material, and tenacious material strongly resistive to line-breakage, in other words, ductile material such as Au alone or the like can be used. The use of tenacious material strongly resistive to line-breakage as the material of the wiring 55 can contribute to prevention of occurrence of line-breakage or disconnection.

Method for Manufacturing Optical Semiconductor Element

Figure 13A:
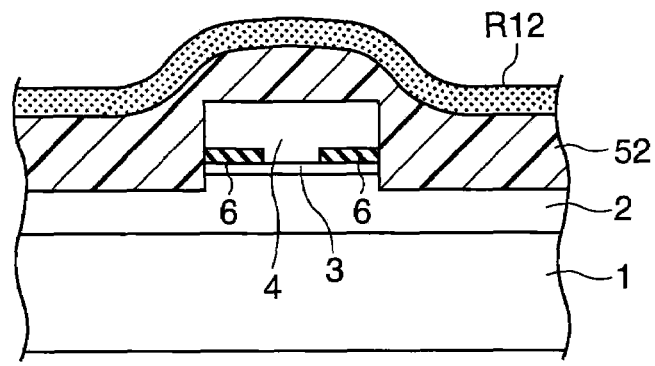
FIGS. 13A-13C are cross-sectional views schematically showing steps of manufacturing the optical semiconductor element of FIG. 10.
Figure 13B:
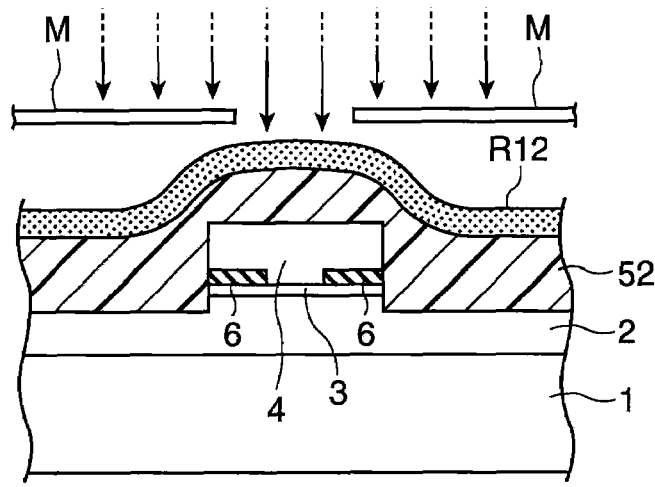
Figure 13C:
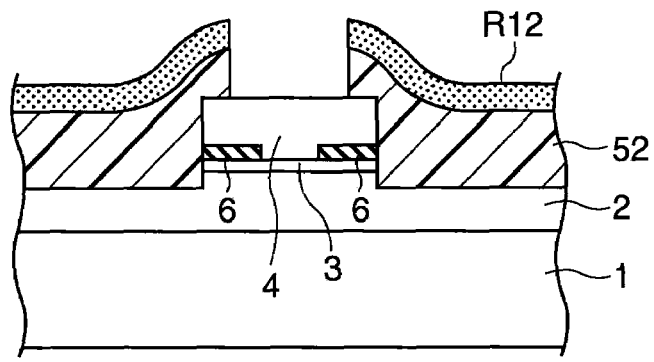
Figure 14:
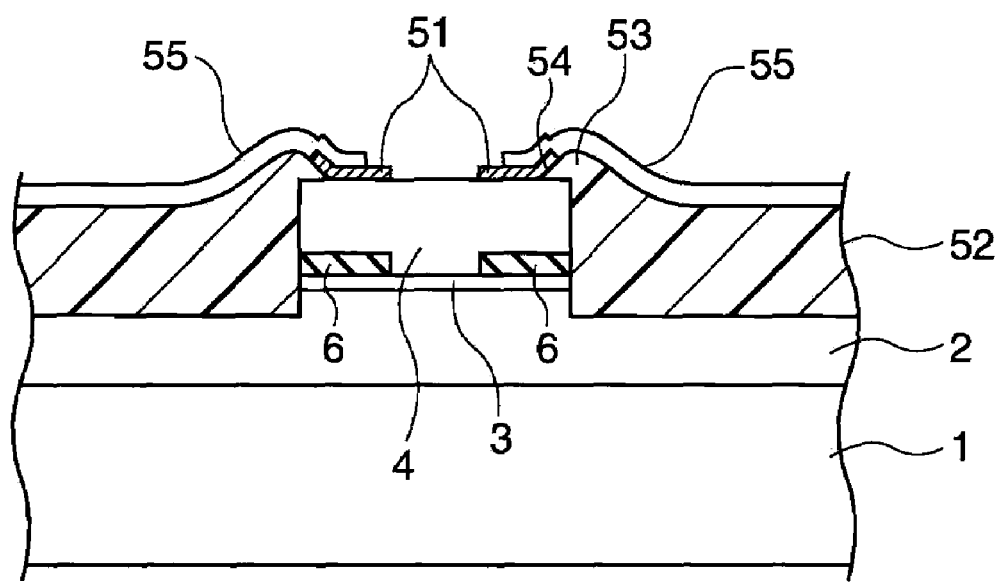
FIG. 14 is a cross-sectional view schematically showing a step of manufacturing the optical semiconductor element of FIG. 10.
Figure 15A:
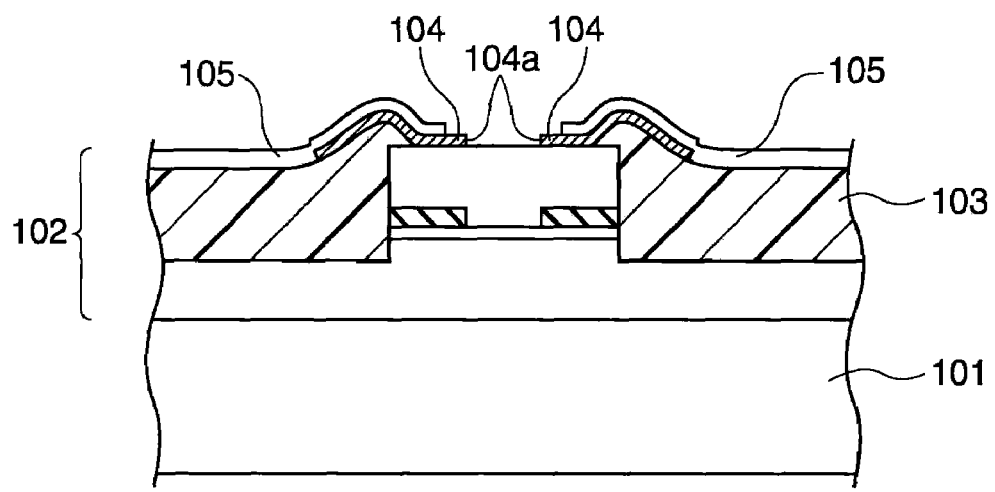
FIGS. 15A and 15B are cross-sectional views of a surface-emitting type semiconductor laser of related art.
Figure 15B:
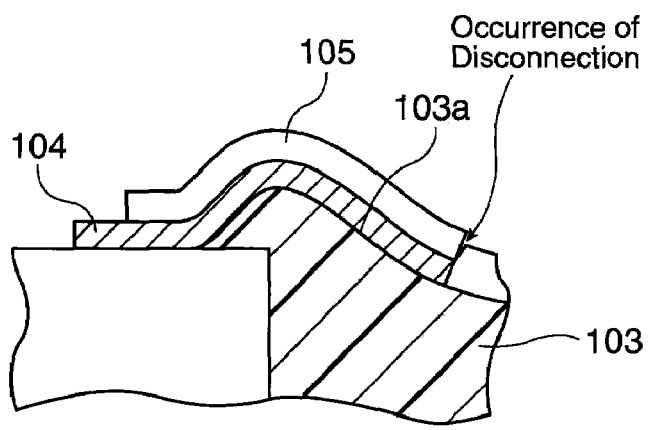

Next, a method for manufacturing the optical semiconductor element D' in accordance with the present embodiment is described. FIG. 12 through FIG. 14 are process drawings showing the steps of manufacturing the optical semiconductor element D'. It is noted that these drawings correspond to the cross-sectional view shown in FIG. 11A.

Figure 12A:
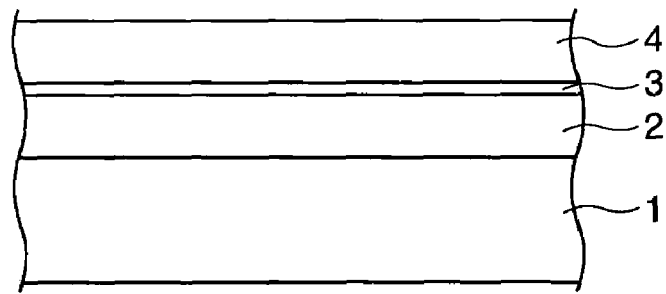
FIGS. 12A-12C are cross-sectional views schematically showing steps of manufacturing the optical semiconductor element of FIG. 10.
Figure 12B:
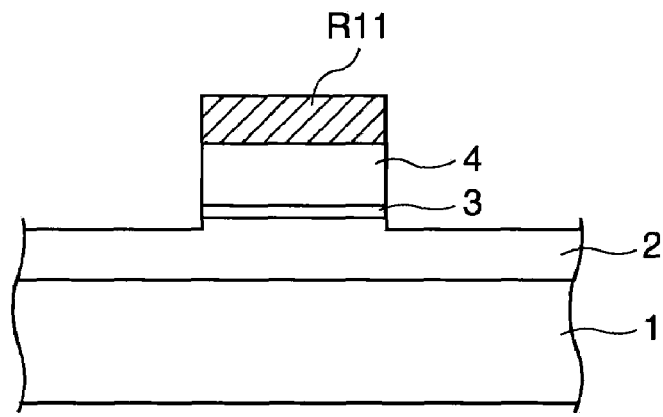

First, on a substrate 1, a first mirror layer 2, an active layer 3 and a second mirror layer 4 are formed by epitaxial growth while modifying its composition (see FIG. 12A). Then, the first mirror layer 2, the active layer 3 and the second mirror layer 4 are patterned (see FIG. 12B). In this step, resist is coated on the second mirror layer 4, and the resist is patterned to form a resist layer R11 having an opening section in a predetermined configuration. Then by using the resist layer R11 as a mask, etching is conducted to form a first columnar section P1'.

Figure 12C:
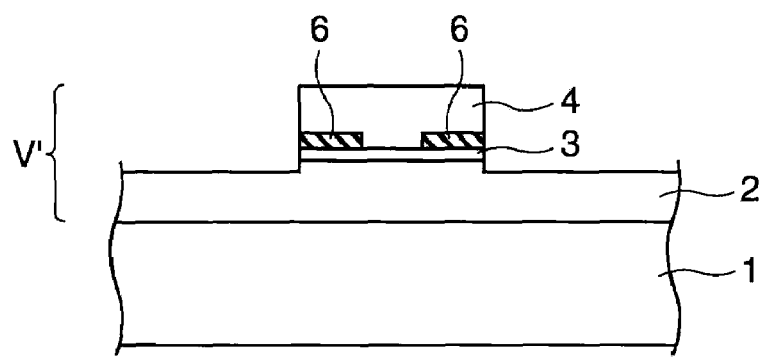

Then, at least one layer in the second mirror layer 4 in the first columnar section P1' near the active layer 3 is oxidized to thereby form a current constricting layer 6 (see FIG. 12C). Next, an insulation layer 52 composed of polyimide resin is formed, and a resist layer R12 is formed on the insulation layer 52 (FIG. 13A). Then, by using a mask M, the resist layer R12 and the insulation layer 52 are exposed (see FIG. 13B) together and developed, thereby patterning the insulation layer 52 (see FIG. 13C). As a result, a central portion of the upper surface of the second mirror layer 4 is exposed, and the insulation layer 52 is formed in a manner to cover the marginal section of the second mirror layer 4.

Then, the resist layer R12 is removed, and an electrode 51 and a wiring 55 are formed. When the resist layer R12 is removed, a surface portion of the insulation layer 52 is removed, thereby forming a hill shape having a gentle slope. In the manner described above, the optical semiconductor element D' is manufactured.

In the optical semiconductor element D' in accordance with the present embodiment, like the first embodiment described above, one end of the electrode 51 is formed on a sloped section 54 that gradually slopes down toward the upper surface of the first columnar section P1' (the second mirror layer 4). As a result, the one end of the electrode 51 is prevented from forming an inversely tapered shape, and disconnection of the wiring 55 can therefore be avoided. Accordingly, the yield in the process of manufacturing the optical semiconductor element D' can be prevented from lowering.

It is noted that the invention is not limited to the embodiments described above, and many changes can be made without departing from the subject matter of the invention. For example, in the embodiments described above, surface-emitting type semiconductor lasers are described. However, without being limited to such devices, the invention is also applicable to other elements, such as, light emitting diodes, and the like. Moreover, in the embodiment described above, a rectification diode is connected in parallel with a surface-emitting type semiconductor laser. However, a light detecting photodiode for monitoring the intensity of light output from a surface-emitting type semiconductor laser or another element may be connected in parallel with the surface-emitting type semiconductor laser.

What is claimed is:

1. An electrode structure comprising:
a first conductive layer:
an insulation layer that covers at least a portion of a marginal area of an upper surface of the first conductive layer and has a first sloped section that slopes down toward the upper surface of the first conductive layer;
a first electrode having one end formed on the first conductive layer and another end formed on the first sloped section;
a third electrode that is formed on the first electrode and the insulation layer, and covers the another end of the first electrode;
a second conductive layer; and
a second electrode having one end formed on the second conductive layer;
wherein the insulation layer that covers at least a portion of a marginal area of an upper surface of the second conductive layer and has a second sloped section that slopes down toward the upper surface of the second conductive layer,
the second electrode has another end formed on the second sloped section,
the third electrode is formed on the second electrode and covers the another end of the second electrode.

2. An electrode structure according to claim 1, wherein the first conductive layer exhibits a first conductivity type, the second conductive layer exhibits a second conductivity type different from the first conductivity type.

3. An optical semiconductor element according to claim 1, wherein the insulation layer has a third sloped section that located between the first sloped section and second sloped section and slopes down from the first sloped section toward the second sloped section, and a forth sloped section that located between the third sloped section and second sloped section and slopes down from the second sloped section toward the third sloped section.

4. An optical semiconductor element according to claim 1, wherein an upper surface of the second electrode is higher than an upper surface of the first electrode and an upper surface of the terminal electrode.

5. An electrode structure comprising:
a first conductive layer;
an insulation layer that covers at least a portion of a marginal area of an upper surface of the first conductive layer and has a first sloped section that slopes down toward the upper surface of the first conductive layer;
a first electrode having one end formed on the first conductive layer and another end formed on the first sloped section;
a third electrode that is formed on the first electrode and the insulation layer, and covers the another end of the first electrode;
a terminal electrode connect with the third electrode,
wherein the second electrode is located between the terminal electrode and the first electrode, and the third electrode covers a part of the second electrode.

* * * * *